(12) United States Patent
Chen et al.

(10) Patent No.: US 9,527,674 B2
(45) Date of Patent: Dec. 27, 2016

(54) TRANSMISSION DEVICE WITH AIR-FLOAT GUIDE WHEEL OF THE LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventors: Zenghong Chen, Guangdong (CN);
Kun Hsien Lin, Guangdong (CN);
Yongqiang Wang, Guangdong (CN);
Weibing Yang, Guangdong (CN);
Minghu Qi, Guangdong (CN);
Chenyangzi Li, Guangdong (CN);
Guokun Yang, Guangdong (CN);
Yunshao Jiang, Guangdong (CN);
Zhiyou Shu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/113,710

(22) PCT Filed: Jul. 11, 2013

(86) PCT No.: PCT/CN2013/079255
§ 371 (c)(1),
(2) Date: Oct. 24, 2013

(87) PCT Pub. No.: WO2015/000192
PCT Pub. Date: Jan. 8, 2015

(65) Prior Publication Data
US 2016/0264360 A1 Sep. 15, 2016

(30) Foreign Application Priority Data
Jul. 2, 2013 (CN) .......................... 2013 1 0275138

(51) Int. Cl.
*B65G 51/03* (2006.01)
*B65G 37/00* (2006.01)
(Continued)

(52) U.S. Cl.
CPC ............. *B65G 37/00* (2013.01); *B65G 49/065* (2013.01); *B65G 49/066* (2013.01); *B65G 51/03* (2013.01);
(Continued)

(58) Field of Classification Search
CPC ....................................... B65G 51/03
(Continued)

(56) References Cited

U.S. PATENT DOCUMENTS 3,223,499 A * 12/1965 Cypher ................... C03B 29/12
414/676
3,647,266 A * 3/1972 Hurd ...................... B65G 51/03
406/83
(Continued)

FOREIGN PATENT DOCUMENTS

CN 1810608 A 8/2006
CN 101580179 A 11/2009
(Continued)

OTHER PUBLICATIONS

Jiantao Li, the International Searching Authority written comments, Apr. 2014, CN.

*Primary Examiner* — Joseph Dillon, Jr.

(57) ABSTRACT

The present invention is provided for a transmission device with air-float guide wheel to guide the liquid crystal display panel, which comprising an air-float supplying platform, two air-float guide groups and a magnetic wheel driving device, wherein a plurality of gas holes are opening on the air-float supplying platform, the two air-float guide groups are assembled at the two sides of the air-float supplying plat-
(Continued)

form, the magnetic wheel is connected with the air-float guide groups, and the air-float guide groups can be rotating with the magnetic wheel rolling, the air can be flowing through the gas holes of the air-float supplying platform, the liquid crystal display panel can be limited and transmitted by the two air-float guide groups in the rolling direction.

8 Claims, 2 Drawing Sheets

(51) Int. Cl.
  *B65G 49/06* (2006.01)
  *H01L 21/677* (2006.01)
  *G02F 1/13* (2006.01)
(52) U.S. Cl.
  CPC ....... *G02F 1/1303* (2013.01); *H01L 21/67706* (2013.01); *H01L 21/67709* (2013.01); *H01L 21/67721* (2013.01); *H01L 21/67784* (2013.01); *B65G 2207/06* (2013.01)
(58) Field of Classification Search
  USPC ............................................ 406/88; 414/676
  See application file for complete search history.

(56) References Cited

U.S. PATENT DOCUMENTS

| | | | | |
|---|---|---|---|---|
| T966,009 I4 * | 1/1978 | Gardineer, Jr. | ... | H01L 21/67784 361/215 |
| 4,681,776 A * | 7/1987 | Bok | ................. | H01L 21/67784 134/21 |
| 4,978,253 A * | 12/1990 | Lazzari | ................. | B65G 51/03 406/86 |
| 5,037,245 A * | 8/1991 | Smith | ................. | B65G 47/5154 406/88 |
| 5,311,979 A * | 5/1994 | Risley | ................. | B65G 21/2054 198/453 |
| 5,921,744 A * | 7/1999 | Toda | ................. | H01L 21/67787 414/755 |
| 6,805,318 B2 * | 10/2004 | Ebner | ................. | B65G 51/03 242/615.11 |
| 7,223,060 B2 * | 5/2007 | Weidenmuller | ........ | B29C 35/16 406/159 |
| 7,329,299 B2 * | 2/2008 | Moriya | ................. | B65G 37/005 406/154 |
| 7,428,959 B2 * | 9/2008 | Jung | ................. | B65G 49/063 198/493 |
| 7,997,289 B1 * | 8/2011 | Frost | ................. | B08B 3/12 134/133 |
| 8,137,046 B2 * | 3/2012 | Kishimoto | ........ | H01L 21/67748 406/88 |
| 8,376,663 B2 * | 2/2013 | Erceg | ................. | B65G 11/123 406/1 |
| 9,004,262 B2 * | 4/2015 | Mader | ................. | B65G 21/209 198/493 |
| 2002/0182047 A1 * | 12/2002 | Adam | ................. | B65G 51/03 414/676 |
| 2003/0146340 A1 * | 8/2003 | Ebner | ................. | B65G 51/03 242/615.11 |
| 2007/0003400 A1 * | 1/2007 | Ikehata | ................. | B65G 49/063 414/676 |
| 2015/0239682 A1 * | 8/2015 | Wang | ................. | H01L 21/67784 414/676 |

FOREIGN PATENT DOCUMENTS

| | | |
|---|---|---|
| CN | 101676181 A | 3/2010 |
| CN | 101759017 A | 6/2010 |
| CN | 102167227 B | 9/2012 |
| CN | 102674004 A | 9/2012 |
| CN | 102815525 A | 12/2012 |
| JP | 2004345744 A | 12/2004 |
| KR | 20120025360 A | 3/2012 |

* cited by examiner

TRANSMISSION DEVICE WITH AIR-FLOAT GUIDE WHEEL OF THE LIQUID CRYSTAL DISPLAY PANEL

FIELD OF THE INVENTION

The present invention relates to the field of liquid crystal display, and in particular to a transmission device with an air-float guide wheel for supplying a liquid crystal display panel.

BACKGROUND OF THE INVENTION

With the development of the OLED technology, the OLED will become the major display panel on the next period. More particularly, the touch screen will be more universally. During the manufacture process of the OLED, the traditional process comprises the following steps: clean, coating film, laser, exposure, etching and photo-resist removal and so on in proper order. The process should be operated on the different machines. Currently, refer to FIG. 1, the liquid crystal display panel can be transmitted to the different machines with the back wheels. But the imprint will be remained on the surface of the liquid crystal display panel on the contact transmitting way. So the film on the surface of liquid crystal display panel will be waved away and then the passing rate will be reduced.

SUMMARY OF THE INVENTION

According to the disadvantage of the prior art, the major purpose of the present invention is provided a non-contact and air-floating transmission device with air-float guide wheel for transmitting the liquid crystal display panel.

The present invention is provided for a transmission device with air-float guide wheel to guide the liquid crystal display panel, which comprising an air-float supplying platform, two air-float guide groups and a magnetic wheel driving device, wherein a plurality of gas holes are opening on the air-float supplying platform, the two air-float guide groups are assembled at the two sides of the air-float supplying platform, the magnetic wheel is connected with the air-float guide groups, and the air-float guide groups can be rotating with the magnetic wheel rolling, the air can be flowing through the gas holes of the air-float supplying platform, the liquid crystal display panel can be limited and transmitted by the two air-float guide groups in the rolling direction.

Preferably, the gas holes on the air-float supplying platform are in parallel, and the gas holes on two sides of the air-float supplying platform are more than that of on the middle to keep the liquid crystal display panel suspending on the air-float supplying platform steadily and ensure it be transmitted smoothly. The gap is 50 mm-80 mm which is located between the gas holes on the two sides of the air-float supplying platform, the gap is 80 mm-120 mm which is located between the gas holes on the middle of the air-float supplying platform.

Preferably, the air-float guide comprising a wheel and a driving column, the driving column is rotating with the magnetic wheel driving device, the wheel is resisted to the liquid crystal display panel, the magnetic wheel driving device can drive the wheel rotating with the driving column rotating, and the liquid crystal display panel can be transmitted in the rotating direction of the wheel. The wheel comprising a top clamp, a bottom clamp and a leading column, the leading column are connecting between the top clamp and the bottom clamp, the liquid crystal display panel is relying on the leading column, the external diameter of the top clamp and the bottom clamp is larger than that of the leading column to limit the liquid crystal display panel.

Preferably, an elastic layer is surrounded the wall of the leading column for contacting to the liquid crystal display panel to reduce the scratching or polluting on the liquid crystal display panel bringing from the friction.

Preferably, a plurality of magnetic wheels are separated assembled on the magnetic wheel driving device for rotating with the each air-float guide. The gap is 100 mm which is located between the adjacent air-float guides. The leading columns of the two air-float guide groups are assembled on the same horizontal plane to keep the liquid crystal display panel remain on a level plane and transmitting steadily.

Compared to the prior art, the present invention provides a transmission device with air-float guide wheel for transmitting the liquid crystal display panel. The two sides of the liquid crystal display panel are clamped by the air-float guide wheels. The non-contact and air-floating transmitting method is replayed the contact transmitting method with the middle wheels of the prior art. Thus, the contact can be maximum reduced which between the liquid crystal display panel and the guide transmission device for resolving the problem that the scratching, polluting or deforming to the liquid crystal display panel producing from the friction with each other, reducing the static electricity produced from the friction of the liquid crystal display panel and improving the passing rate and capacity of the liquid crystal display panel. At the same time, with the non-contacting magnetic wheel driving device will replay the prior gear transmitting method, the particle will be reduced so as to avoid the liquid crystal display panel be polluted on the transmitting. In addition, with the gas holes on the air-float supplying platform are in parallel and the gas holes on two sides of the air-float supplying platform are more than that of on the middle, the transmitting of the liquid crystal display panel will be more smoothly. The elastic layer is surrounded the air-float guide to avoid the liquid crystal display panel broken by the air-float guide pressing.

DETAILED DESCRIPTION OF THE PREFERRED EMBODIMENTS

Figure 1:
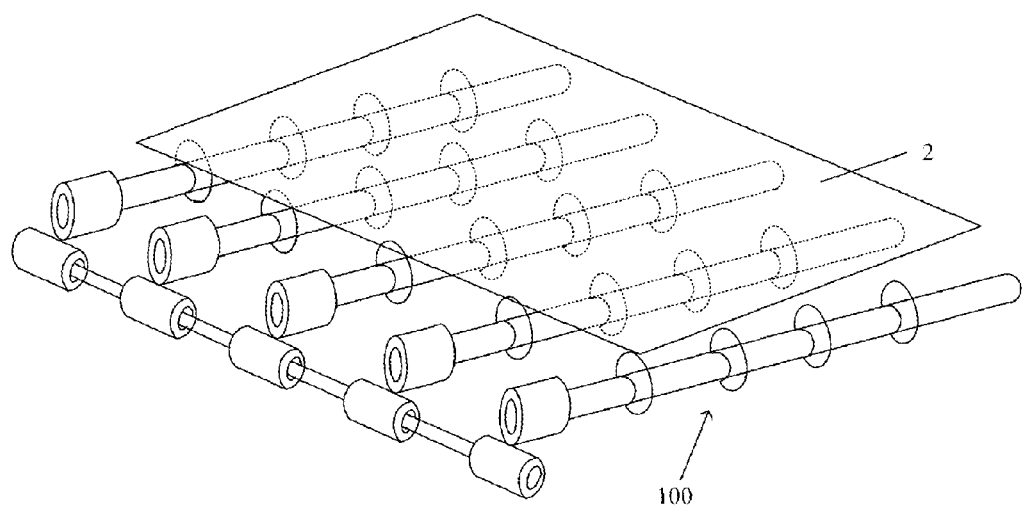
FIG. 1 is a schematic view showing the transmission device of the liquid crystal display panel according to the prior art.
Figure 2:
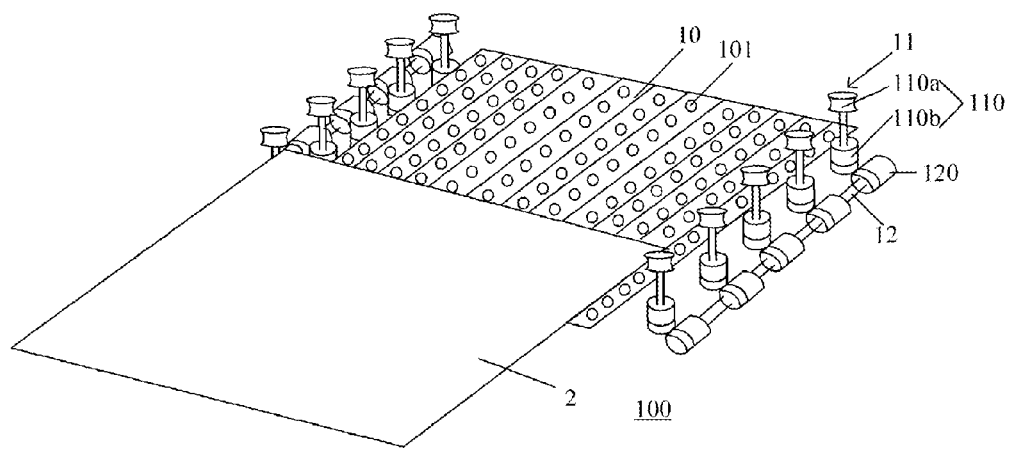
FIG. 2 is a schematic view showing the transmission device with air-float guide wheel for transmitting the liquid crystal display panel according to the present invention.
Figure 3:
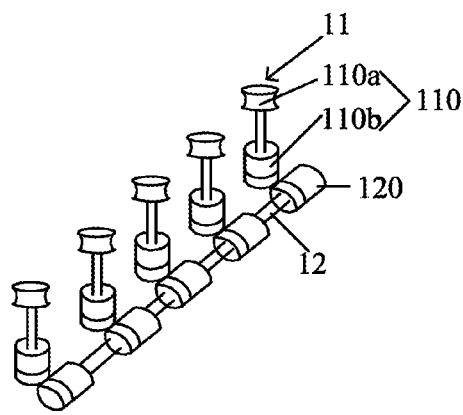
FIG. 3 is a combined state view showing the air-float guide and the magnetic wheel driving device of the transmission device with air-float guide wheel for transmitting the liquid crystal display panel according to the present invention.

Refer to FIG. 2, the present invention is provided for a transmission device with air-float guide wheel 100, which guiding and transmitting the liquid crystal display panel 2 with a pneumatic type, comprising a air-float supplying platform 10, two air-float guide groups 11 and a magnetic wheel driving device 12. Wherein, a plurality of gas holes 101 are opening on the air-float supplying platform 10, the two air-float guide groups 11 are assembled at the two sides of the air-float supplying platform 10. The magnetic wheel driving device 12 is connecting with the air-float guide groups 11, and the air-float guide groups 11 can be rotating with the magnetic wheel driving device 12 rolling, then the air can be flowing through the gas holes 101 of the air-float supplying platform 10, the liquid crystal display panel 2 can be limited and transmitted by the two air-float guide groups 11 in the rolling direction.

In the present invention, the air-float supplying platform 10 is in parallel to the liquid crystal display panel 2 and the width of the air-float supplying platform 10 is equal to that of the liquid crystal display panel 2. A plurality of gas holes 101 are endwise opening along the transmitting direction of the liquid crystal display panel 2. The gas holes 101 are connecting with the air pump. The air can be flowed to the liquid crystal display panel 2 through the gas holes 101 by the air pump. All the gas holes are connecting with the same air pump which is provided to supply the air source. The gas holes of each groups are in parallel to each other, and connecting with the air injecting equipment (no labeled), and then the air are leaded from the air injecting equipment and flowed upward through gas holes 101 for keeping the liquid crystal display panel 2 suspending above the air-float supplying platform 10. The liquid crystal display panel 2 can be supplied by the flowing air with no contacting between the under surface of the liquid crystal display panel and the transmission device on the transmitting process, so as to avoid scratching, polluting and deforming problems produced from the contact of the transmission device and reduce the static electricity produced from the friction of the liquid crystal display panel.

Figure 4:
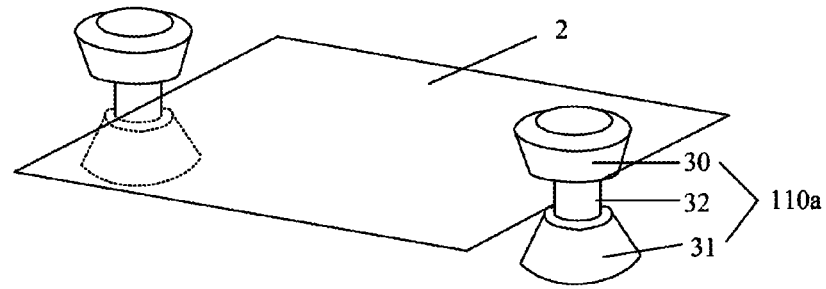
FIG. 4 is a combined state view showing the air-float guide cooperating with the magnetic wheel driving device of the transmission device with air-float guide wheel for transmitting the liquid crystal display panel according to the present invention.
Figure 5:
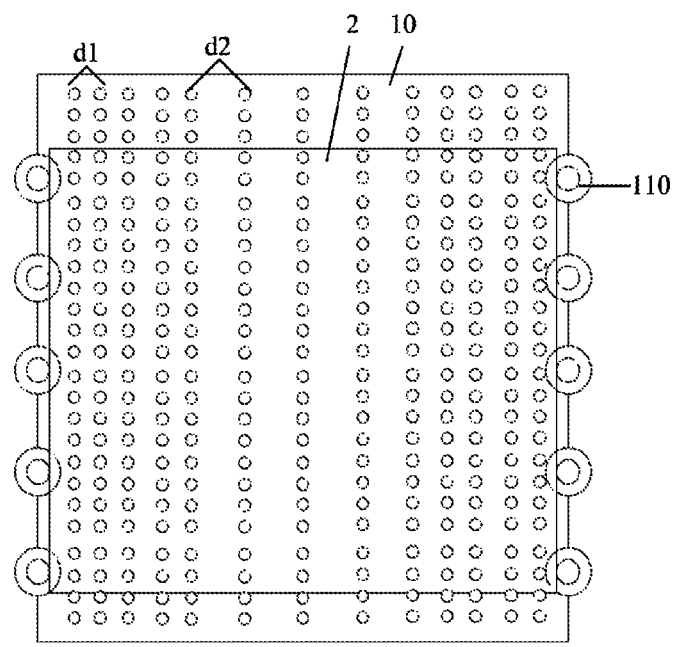
FIG. 5 is a vertical view showing the transmission device with air-float guide wheel for transmitting the liquid crystal display panel according to the present invention.

In the one of prefer embodiment of the invention, the gas holes of the air-float supplying platform 10 are in parallel and the gas holes of the two sides are more than that of on the middle. The arrangement way of the gas holes is the number on the two sides more than that of on the middle, therefore, the pressure of the two sides is larger than that of on the middle to keep the liquid crystal display panel 2 suspending above the air-float supplying platform 10, so the gas leak problem from the two sides of the air-float supplying platform can be resolved in the enclosed place, and ensure the liquid crystal display panel transmit on the same level and improve the passing rate. Refer to FIG. 4, the gap d1 of the gas holes on the two sides of the air-float supplying platform is 50 mm~80 mm, preferably, the gap d1 is 65 mm; the gap d2 of the gas holes on the middle of the air-float supplying platform is 80 mm~110 mm, preferably, the gap d2 is 95 mm In another prefer embodiment of the invention, the air-float guide groups 11 comprises a plurality of air-float guides 110. The elastic layer is surrounded the air-float guides 110 for contacting with the liquid crystal display panel 2. The air-float guides 110 are formed to be one straight line and located at the two sides of the air-float supplying platform 10. The liquid crystal display panel 2 is suspending above the air-float guides 110. With the contact between the elastic layer and the liquid crystal display panel 2, the scratching will be reduced which is on the liquid crystal display panel 2 bringing from the friction.

The air-float guide 110 comprises a wheel 110a and a driving column 110b, one end of the driving column 110b is supplying the wheel 110a, and the other end is connecting with the magnetic wheel driving device 12, then the power of the magnetic wheel driving device 12 can be transmitted to the wheel 110a for driving it rolling together. The wheel 110a is resisted to the liquid crystal display panel 2. The magnetic wheel driving device 12 can drive the wheel 110a rotating with the driving column rotating 110b, and the liquid crystal display panel 2 can be transmitted in the rotating direction of the wheel 110a. The air-float guide groups 11 can be rotating with the magnetic wheel driving device 12 to supply the power for driving the liquid crystal display panel 2 moving forward.

The wheel 110a comprising a top clamp 30, a bottom clamp 31 and a leading column 32, the leading column 32 are connecting between the top clamp 30 and the bottom clamp 31, the liquid crystal display panel 2 is relying on the leading column 32, the external diameter of the top clamp 30 and the bottom clamp 31 is larger than that of the leading column 32, then the liquid crystal display panel 2 can be limited between the top clamp 30 and the bottom clamp 31 for preventing it falling off or sliding from the air-float guides 110 during the transmitting process. The leading column 32 is to be a cylinder-shaped to make the contact smoother with the liquid crystal display panel 2. In addition, an elastic layer is surrounded the wall of the leading column 32 for contacting to the liquid crystal display panel 2. Therefore, the liquid crystal display panel 2 will be not scratched, polluted or deformed by the transmission device, and the static electricity will be reduced which produced from the friction between the liquid crystal display panel 2 and the air-float supplying platform 10, as a result, the passing rate can be improved in the every manufacture procedure and then the capacity also can be enhanced. The elastic layer is made of the elasticity rubber ring. The elastic layer can effectively buffer the contact between the liquid crystal display panel and the air-float guides and avoid the broken of the liquid crystal display panel because of the press driving by the air-float guides.

The magnetic wheel driving device 12 comprises a magnetic wheel 120 and a driving column 122 in interval. The magnetic wheels 120 are assembled on the driving column 122 and rolling with the air-float guides 110. The air-float guide 110 is also to be magnetic wheel. The magnetism of the air-float guide 110 and the magnetic wheel 120 are to be the same, and the air-float guide 110 is vertical to the magnetic wheel 120 to make them repel to each other and keep them remain a non-contact state. The driving column 122 can rotate by the AC motor driving, then the motive power can be transmitted to the magnetic wheel 120 with the rotating of the driving column 122 and lead the magnetic wheel 120 rotating and the air-float guide 110 rotating synchronously, and then the liquid crystal display panel 2 can be transmitted with the rolling of the air-float guide 110. The gap is 100 mm which is between the adjacent air-float guides 110. The leading columns 32 of the two air-float guide groups 11 are assembled on the same horizontal plane to keep the liquid crystal display panel remain level and steadily. The number of the air-float guides depends on the size of the liquid crystal display panel.

What is claimed is:

1. A transmission device having air-float guide wheel is provided for guiding the liquid crystal display panel, the transmission device comprising an air-float supplying platform, two air-float guide groups and a magnetic wheel driving device, wherein a plurality of as holes are opening on the air-float supplying platform, the two air-float guide groups are assembled at the two opposite sides of the air-float supplying platform, the magnetic wheel driving device is connected with the air-float guide groups, and the air-float guide groups can be rotating with the magnetic wheel rolling, the air can be flowing through the gas holes of the air-float supplying platform, a liquid crystal display panel can be limited and transmitted by the two air-float guide groups in a delivering direction, the gas holes on two sides of the air-float supplying platform are more than that of on the middle, wherein the air-float guide groups comprising a plurality of air-float guides, the elastic layer is assembled on the air-float guides for contacting with the liquid crystal display panel, wherein the air-float guide groups comprising a wheel and a driving column, the driving column is rotating with the magnetic wheel driving device, the wheel is resisted to the liquid crystal display panel, the magnetic wheel driving device can drive the wheel rotating with the driving column rotating, and the liquid crystal display panel can be transmitted in the rotating direction of the wheel, wherein the wheel comprising a top clamp, a bottom clamp and a leading column, the leading column are connecting between the top clamp and the bottom clamp, the liquid crystal display panel is relying on the leading column, wherein the external diameter of the top clamp and the bottom clamp is larger than that of the leading column.

2. The transmission device having air-float guide wheel according to claim 1, wherein an elastic layer is surrounded the wall of the leading column for contacting to the liquid crystal display panel.

3. The transmission device having air-float guide wheel according to claim 1, wherein the gas holes on the air-float supplying platform are in parallel.

4. The transmission device having air-float guide wheel according to claim 1, wherein a plurality of magnetic wheels are separated assembled on the magnetic wheel driving device for rotating with the each air-float guide.

5. The transmission device having air-float guide wheel according to claim 4, wherein the gap is 100 mm which is located between the adjacent air-float guides.

6. The transmission device having air-float guide wheel according to claim 4, wherein the leading columns of the two air-float guide groups are assembled on the same horizontal plane.

7. The transmission device having air-float guide wheel according to claim 1, wherein the gap is 50 mm~80 mm which is located between the gas holes on the two sides of the air-float supplying platform.

8. The transmission device having air-float guide wheel according to claim 7, wherein the gap is 80 mm~120 mm which is located between the gas holes on the middle of the air-float supplying platform.

* * * * *